United States Patent
Boumaalif et al.

(10) Patent No.: US 10,917,077 B1
(45) Date of Patent: Feb. 9, 2021

(54) PHASE COHERENT AND FREQUENCY HOPPING NUMERICALLY CONTROLLED OSCILLATOR

(71) Applicant: Xilinx, Inc., San Jose, CA (US)

(72) Inventors: Ali Boumaalif, Cork (IE); John E. McGrath, Cahir (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/694,485

(22) Filed: Nov. 25, 2019

(51) Int. Cl.
| G06F 1/03 | (2006.01) |
| H03C 3/00 | (2006.01) |
| H03K 5/00 | (2006.01) |
| H03K 4/08 | (2006.01) |

(52) U.S. Cl.
CPC ....... *H03K 5/00006* (2013.01); *G06F 1/0335* (2013.01); *G06F 1/0342* (2013.01); *H03K 4/08* (2013.01); *H03C 3/00* (2013.01)

(58) Field of Classification Search
CPC .... G06F 1/0335; G06F 1/0342; G06F 1/0328; G06F 1/0321; H03C 3/00
See application file for complete search history.

(56) References Cited

U.S. PATENT DOCUMENTS

| 4,992,743 A * | 2/1991 | Sheffer ................. G06F 1/0342 327/106 |
| 7,952,516 B2 * | 5/2011 | Atherton ............... G06F 1/0335 342/200 |
| 9,432,079 B1 * | 8/2016 | Kumar .................. H04B 1/713 |

* cited by examiner

*Primary Examiner* — Ryan Johnson
(74) *Attorney, Agent, or Firm* — Patterson + Sheridan, LLP

(57) ABSTRACT

A device includes a plurality of phase accumulators, a multiplexer, and an oscillator. The plurality of phase accumulators is configured to receive a plurality of frequencies and generate a plurality of ramp signals. The multiplexer is configured to receive the plurality of ramp signals from the plurality of phase accumulators and to select one ramp signal from the plurality of ramp signals. The oscillator is configured to receive the one selected ramp signal and to generate one amplitude signal associated therewith. The plurality of phase accumulators continues generating their respective ramp signal. The multiplexer subsequent to selecting the one ramp signal is configured to select another ramp signal associated with another one phase accumulator of the plurality of phase accumulators. The oscillator is further configured to receive the selected another ramp signal and to generate another amplitude signal associated therewith.

20 Claims, 7 Drawing Sheets

Phase Accumulator at Freq 1
192

Phase Coherent Accumulator at Freq 1 → Freq 2 → Freq 1
194

PHASE COHERENT AND FREQUENCY HOPPING NUMERICALLY CONTROLLED OSCILLATOR

TECHNICAL FIELD

The disclosure generally relates to frequency mixers and more particularly to frequency mixers with phase coherency.

BACKGROUND

Typically, radio frequency (RF) systems use fine mixers to allow the input data to shift up or down in frequency by an arbitrary amount depending on whether they are positioned on a digital down converter or digital up converter data path. Some conventional systems use numerically controlled oscillators (NCO) for shifting frequency. Unfortunately, a generic NCO requires resynchronization following a frequency update, resulting in an increased latency, because a generic NCO continuously generates a signal based on a single frequency. Some have used multiple NCOs or multiple oscillators in order to shift frequency. Unfortunately, using multiple NCOs or multiple oscillators increase valuable area and power usage and increase the cost.

SUMMARY

Accordingly, it is desirable to implement a mixer to achieve frequency hopping while maintaining phase coherency, thereby eliminating a need for resynchronization and reducing latency. Moreover, it is desirable to implement a mixer to achieve phase coherent frequency hopping with minimal impact on area and power usage, e.g., by using a single oscillator such as sine generator and/or cosine generator.

In some embodiments, a device includes a plurality of phase accumulators, a multiplexer, and a sine generator. Each phase accumulator of the plurality of phase accumulators is configured to receive a respective frequency and a respective phase and each phase accumulator is clocked in by a clocking signal. Each phase accumulator is configured to generate a frequency ramp signal with a same frequency as its respective frequency and its phase changes from its respective phase by a step size as each phase accumulator is clocked in by the clocking signal. The multiplexer is configured to receive the plurality of frequency ramp signals from the plurality of phase accumulators and to select one frequency ramp signal associated with one phase accumulator of the plurality of phase accumulators. The sine generator is configured to receive the one selected frequency ramp signal and to generate one amplitude signal associated therewith. Each phase accumulator of the plurality of phase accumulators continues generating their respective frequency ramp signal simultaneously. The multiplexer subsequent to selecting the one frequency ramp signal is configured to select another frequency ramp signal associated with another one phase accumulator of the plurality of phase accumulators and the sine generator is further configured to receive the selected another frequency ramp signal and to generate another amplitude signal associated therewith. The another amplitude signal is a frequency hop with respect to the one amplitude signal and phase coherency between the one selected frequency ramp signal and the another selected frequency ramp signal is maintained.

In some embodiments, the device further includes a cosine generator configured to receive the one selected frequency ramp signal and to generate a complex amplitude signal associated therewith. It is appreciated that each phase accumulator of the plurality of phase accumulators is clocked at a sampling frequency. According to some embodiments, the respective phase for each phase accumulator of the plurality of phase accumulators is the same. In one illustrative example, the step size for each phase accumulator of the plurality of phase accumulators is the same. The phase changes are within a −180 degrees to 180 degrees or 0 degrees to 360 degrees. According to some embodiments, the multiplexer is configured to receive a select signal to select a frequency ramp signal from the plurality of frequency ramp signals. According to some embodiments, the select signal is user configurable, e.g., user programmable via a programmable device. It is appreciated that in some embodiments the phase for each frequency ramp signal changes from its respective phase by the step size until overall 360 degrees is spanned upon which the phase returns back to its respective phase. According to one embodiment, the respective frequency associated with each phase accumulator of the plurality of phase accumulators are different from one another.

In some embodiments a device includes a plurality of phase accumulators, a multiplexer, and an oscillator. The plurality of phase accumulators is configured to receive a plurality of frequencies and generate a plurality of ramp signals. The multiplexer is configured to receive the plurality of ramp signals from the plurality of phase accumulators and to select one ramp signal from the plurality of ramp signals. The oscillator is configured to receive the one selected ramp signal and to generate one amplitude signal associated therewith. The plurality of phase accumulators continues generating their respective ramp signal. The multiplexer subsequent to selecting the one ramp signal is configured to select another ramp signal associated with another one phase accumulator of the plurality of phase accumulators. The oscillator is further configured to receive the selected another ramp signal and to generate another amplitude signal associated therewith.

In some embodiments, the another amplitude signal is a frequency hop with respect to the one amplitude signal and phase coherency between the one selected ramp signal and the another selected ramp signal is maintained. According to some embodiments, the oscillator includes a sign and/or a cosine generator. It is appreciated that each phase accumulator of the plurality of phase accumulators is clocked at a sampling frequency. Furthermore, in some embodiments, the phase for each phase accumulator of the plurality of phase accumulators is the same. It is appreciated that a step size for each phase accumulator of the plurality of phase accumulators may be the same. According to one embodiment, the phase changes are within a −180 degrees to 180 degrees or 0 degrees to 360 degrees. The multiplexer is configured to receive a select signal to select a ramp signal from the plurality of ramp signals. According to some embodiments, the select signal is user controllable.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
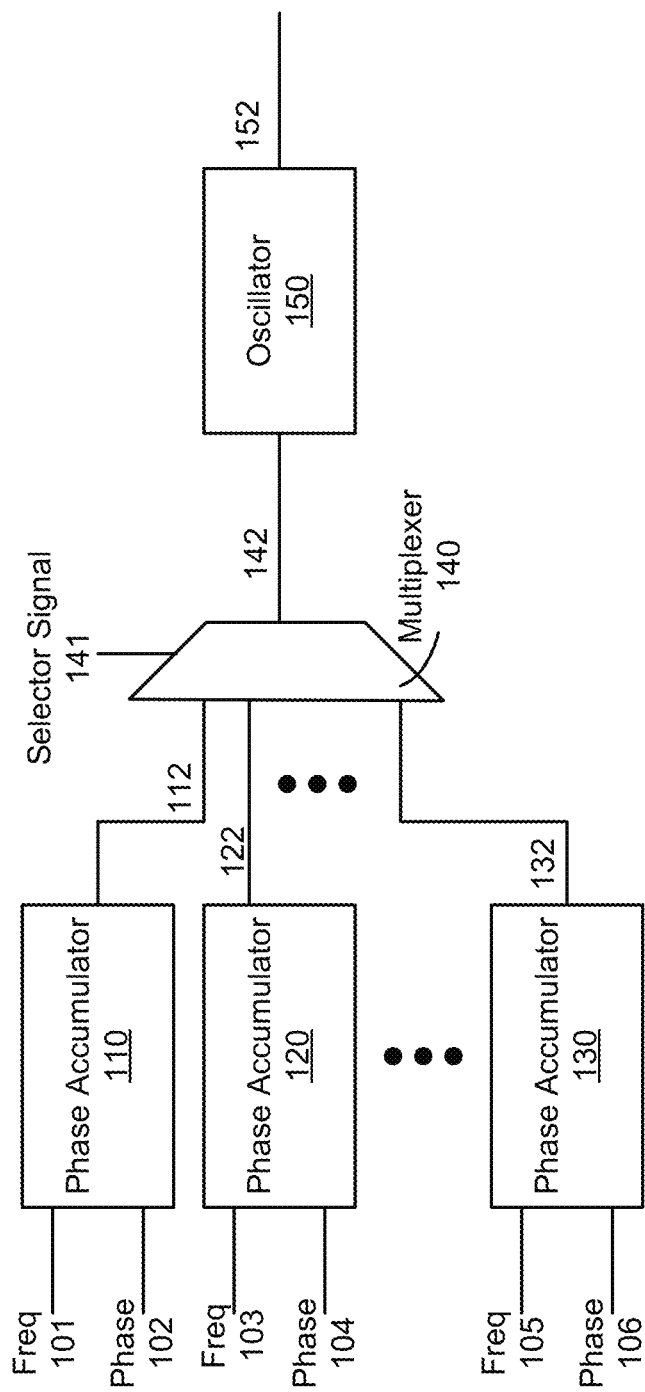
FIGS. 1A-1B show block diagrams depicting a mixer device with coherent phase, according to some examples.

Examples described herein relate to a device with radio frequency (RF) system. In general, RF systems used in wireless and radar systems include mixers that may be used to shift the frequency of a signal, e.g., shift up data signal, shift down data signal, etc. It is desirable to implement a mixer to achieve frequency hopping while maintaining phase coherency, thereby eliminating a need for resynchronization and to reduce latency. Moreover, it is desirable to implement a mixer to achieve phase coherent frequency hopping with minimal impact on area usage, e.g., by using a single oscillator such as sine generator and/or cosine generator.

According to some embodiments, multiple phase accumulators are used. Each phase accumulator generates a signal (also referred to as ramp signal or frequency ramp signal). The output of each phase accumulator is fed into as an input of a multiplexer. The multiplexer is controlled by a select signal to select an output of one accumulator from the multiple phase accumulators. Once the ramp signal from one of the phase accumulators is selected, an oscillator is used to generate a signal associated therewith, e.g., generating amplitude signal. Each phase accumulator continues to generate ramp signals where the frequency is maintained as its phase is changes. Thus, when a different frequency is desired, e.g., frequency hop to shift up or shift down, the multiplexer is configured to select the output signal from the appropriate phase accumulator. Since the phase accumulators continue generating their output signal, the phase coherency between the output signals of the phase accumulators are maintained. Thus, the need to resynchronize is eliminated and latency is reduced. Furthermore, since a single oscillator, e.g., a sine generator and/or cosine generator, is used the areal impact is reduced in comparison to utilizing multiple oscillators.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

Some general concepts will first be described to clarify terms and nomenclature used throughout this description.

Figure 1B:
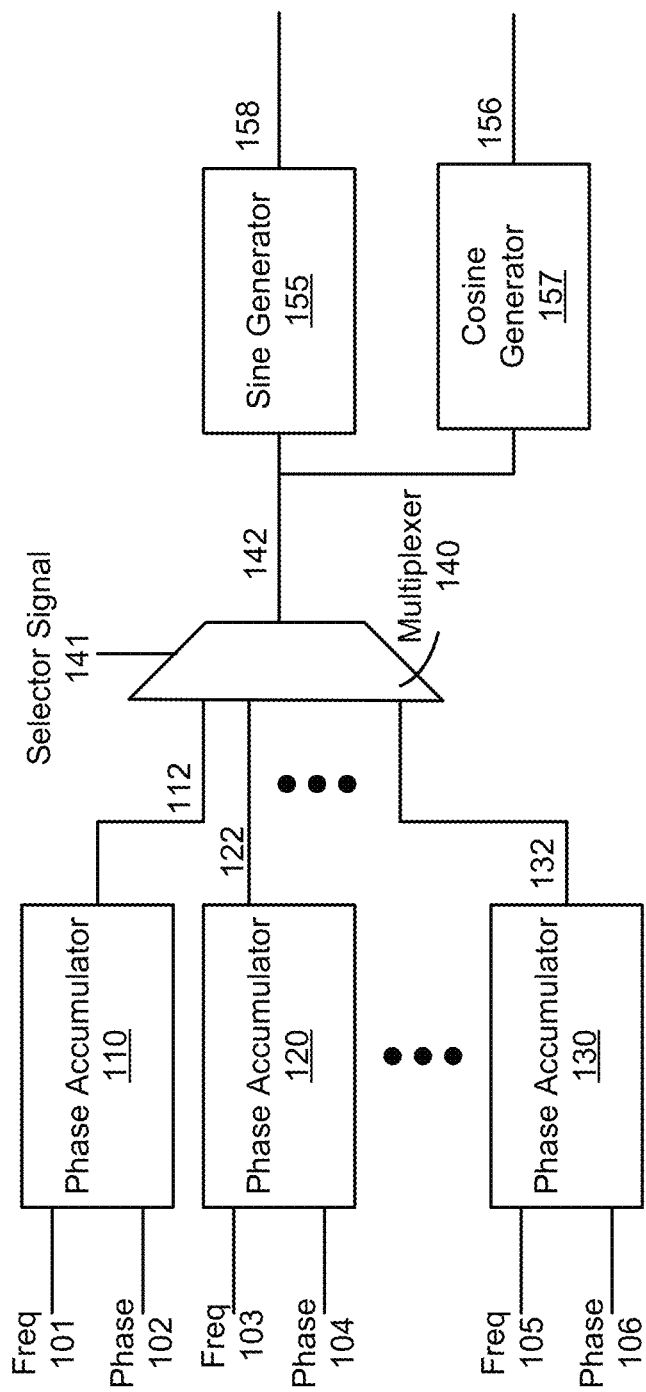

Referring now to FIGS. 1A-1B, block diagrams depicting a mixer device with coherent phase, according to some examples are shown. In FIG. 1A, a mixer may include phase accumulators 110, 120, . . . , 130 coupled to a multiplexer 140, which is coupled to an oscillator 150, e.g., numerically controlled oscillator (NCO), a sine generator, a cosine generator, etc.

Each phase accumulator receives its respective frequency and phase. For example, Phase accumulator 110 receives frequency 101 and phase 102. Phase accumulator 120 receives frequency 103 and phase 104. Phase accumulator 130 receives frequency 105 and phase 106. It is appreciated that the respective frequency and phase received by each phase accumulator may be hard coded or it may be programmable. It is appreciated that the value of the input frequency for each phase accumulator may be different from one another. For example, frequencies 101, 103, . . . , and 105 may be different from one another, thereby enabling a shift up/down frequency during a frequency hop. It is further appreciated that in some embodiments, the phase associated with each phase accumulator may be the same as one another, e.g., phase 102, 104, . . . , and 106 may have the same value. It is appreciated that in some embodiments, the phase associated with each phase accumulator may be different from one another, e.g., phase 102, 104, . . . , and 106 may have different values. It is further appreciated that in some embodiments while some phase accumulators may have the same phase value as their input, other phase accumulators may have a different phase input value from one another. In some embodiments, the value for the frequency and phase may be set via a user input. Each phase accumulator generates a signal (also referred to as ramp signal or frequency ramp signal) based on its input frequency signal (i.e. frequency value) and phase signal (i.e. phase value). It is appreciated that each phase accumulator generates its respective output signal simultaneously and in parallel as other phase accumulators within the mixer.

Each signal generated by each phase accumulator has a frequency corresponding to its input frequency and its phase is changed over time from its respective phase (i.e. input phase value) by its step size until 360 degree is spanned. Once 360 degree is spanned the phase may reset to its original value in some embodiments or it may overflow to modulo(ramp, 360 degree)+Phase. For example, the phase accumulator 110 generates an output signal 112. The output signal 112 has a frequency corresponding to frequency 101 value. The output signal 112 has an initial phase corresponding to phase 102 value. At each clocking signal, the output signal 112 maintains the frequency while the phase of the output signal 112 changes from its initial phase 102 by a step size (e.g., set by the phase accumulator 110) until the entire phase range is spanned, e.g., from −180 to 180 degrees, or from 0 to 360 degrees. Once the entire phase range is spanned the phase of the output signal 112 returns to its original phase 102 value or it may overflow to modulo(ramp, 360 degree)+Phase and the process repeats. Similarly, the phase accumulator 120 generates an output signal 122. The output signal 122 has a frequency corresponding to frequency 103 value. The output signal 122 has an initial phase corresponding to phase 104 value. At each clocking signal, the output signal 122 maintains the frequency while the phase of the output signal 122 changes from its initial phase 104 by a step size (e.g., set by the phase accumulator 120) until the entire phase range is spanned, e.g., from −180 to 180 degrees, or from 0 to 360 degrees. Once the entire phase range is spanned the phase of the output signal 122 returns to its original phase 104 value or it may overflow to modulo(ramp, 360 degree)+Phase and the process repeats. Similarly, the phase accumulator 130 generates an output signal 132. The output signal 132 has a frequency corresponding to frequency 105 value. The output signal 132 has an initial phase corresponding to phase 106 value. At each clocking signal, the output signal 132 maintains the frequency while the phase of the output signal 132 changes from its initial phase 106 by a step size (e.g., set by the phase accumulator 130) until the entire phase range is spanned, e.g., from −180 to 180 degrees, or from 0 to 360 degrees. Once the entire phase range is spanned the phase of the output signal 132 returns to its original phase 106 value or it may overflow to modulo(ramp, 360 degree)+Phase and the process repeats.

The multiplexer 140 receives the output signals from the phase accumulators. For example, the multiplexer 140 receives signals 112, 122, . . . , 132. The multiplexer 140 also receives a select signal 141. The multiplexer 140 based on the select signal 141 selects one of the received signals 112, 122, . . . , 132. For example, the select signal 141 may indicate that signal 112 is to be selected. Similarly, the select signal 141 may indicate that signal 122 or signal 132 should be selected. The selected signal is output 142 to the oscillator 150. The oscillator 150 receives the selected signal 142 and generates a signal in response thereto. For example, the oscillator 150 may generate an output signal 152 that is an amplitude signal based on the selected signal 142. The output signal 152 has the same frequency as the input signal 142, which has the same frequency as the selected signal by the multiplexer 140.

It is appreciated that each phase accumulator continues generating its corresponding ramp signal. At a later time, a different frequency may be desired for a frequency hop, e.g., shift up/shift down. As such, the select signal 141 may identify a different ramp signal corresponding to a different phase accumulator to be selected. For example for illustrative purposes it is presumed that initially the ramp signal 122 corresponding to the phase accumulator 120 is selected and at a later time the select signal 141 identifies the phase accumulator 110 and its corresponding ramp signal 112 to be selected. Thus, the multiplexer 140 outputs its signal 142 that now corresponds to the signal 112 instead of signal 122. The oscillator 150 then generates its output signal 152 that now corresponds to the signal 112 instead of signal 122. Since each phase accumulator continues generating its output signal regardless of which output signal corresponding to a phase accumulator is selected by the multiplexer 140, the phase coherency between the phase accumulators is maintained. Thus, when a different output signal corresponding to a phase accumulator is selected for a frequency hop, the frequency up/down shift is accomplished while the phase is maintained, thereby eliminating the need for resynchronization. Furthermore, since a single oscillator is used, the areal usage is not increased.

Referring now to FIG. 1B, an embodiment similar to FIG. 1A is shown. In this embodiment, the oscillator 150 is replaced with a sine generator 155 and optionally a cosine generator 157 generating an output signals 158 and 156 respectively. It is appreciated that the sine generator 155 generates an amplitude signal while the cosine generator 157 may be used when complex amplitude component is desired.

Figure 1C:
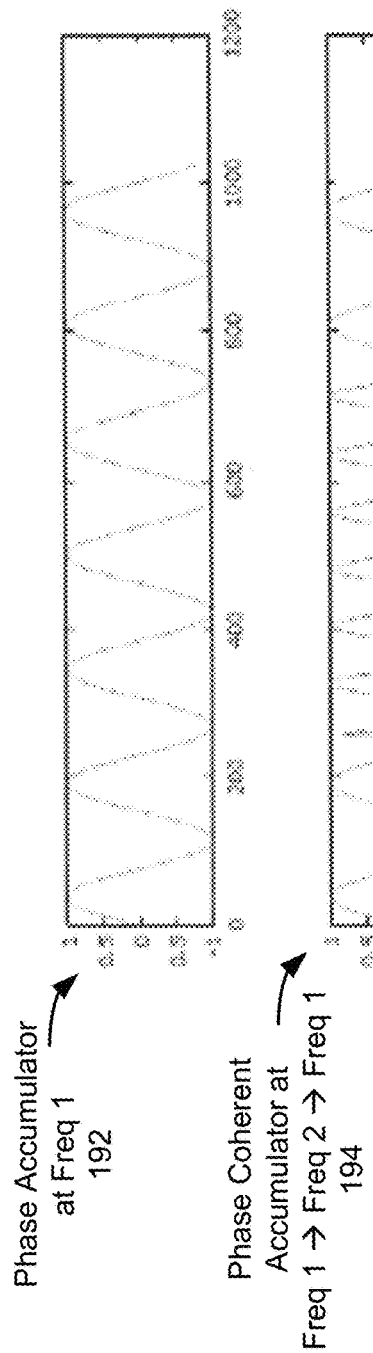
FIG. 1C shows a frequency hop while phase coherency is maintained, according to some embodiments.

Referring now to FIG. 1C, a frequency hop while phase coherency is maintained, according to some embodiments (e.g., FIG. 1A, FIG. 1B) is shown. The top figure illustrates a ramp signal 192 associated with a phase accumulator at frequency value of Freq 1. The bottom figure illustrates a ramp signal 194 hopping from a frequency value of Freq 1 to Freq 2 and back to Freq 1. As illustrated, while the frequency shift up/down is achieved, the phase coherency is maintained.

It is appreciated that the number of phase accumulators shown is for illustrative purposes and should not be construed as limiting the scope of the embodiments. For example, in some embodiments, ten phase accumulators each with a different input frequency may be used while in other embodiments fifteen phase accumulators each with a different input frequency may be used. It is appreciated that as the number of phase accumulators increases the granularity for frequency hop increases.

Figure 2:
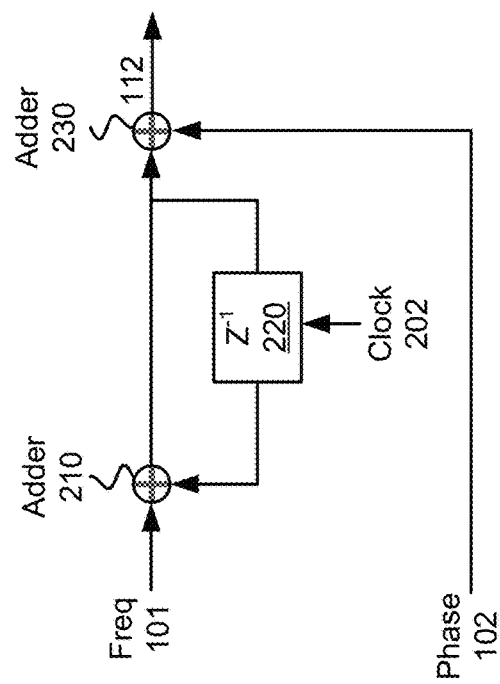
FIG. 2 shows an illustrative phase accumulator, according to some examples.

Referring now to FIG. 2, an illustrative phase accumulator 110, according to some examples is shown. The phase accumulator 110 may receive the frequency 101 value and the phase 102 value, as discussed above. The phase accumulator 110 may include adders 210 and 230. The adder 210 receives the frequency 101 value and the phase 102 value is changed by a step size identified by the register 220 and clocked in using a clocking 202 signal. It is appreciated that the clocking signal 202 may be a sampling frequency. The step size associated with the phase is added to the original phase 102 value using adder 230 until the entire phase is spanned, e.g., −180 degrees to 180 degrees or 0 degrees to 360 degrees. It is appreciated that other phase accumulators of the mixer may have a structure similar to that of the phase accumulator 110.

Figure 3:
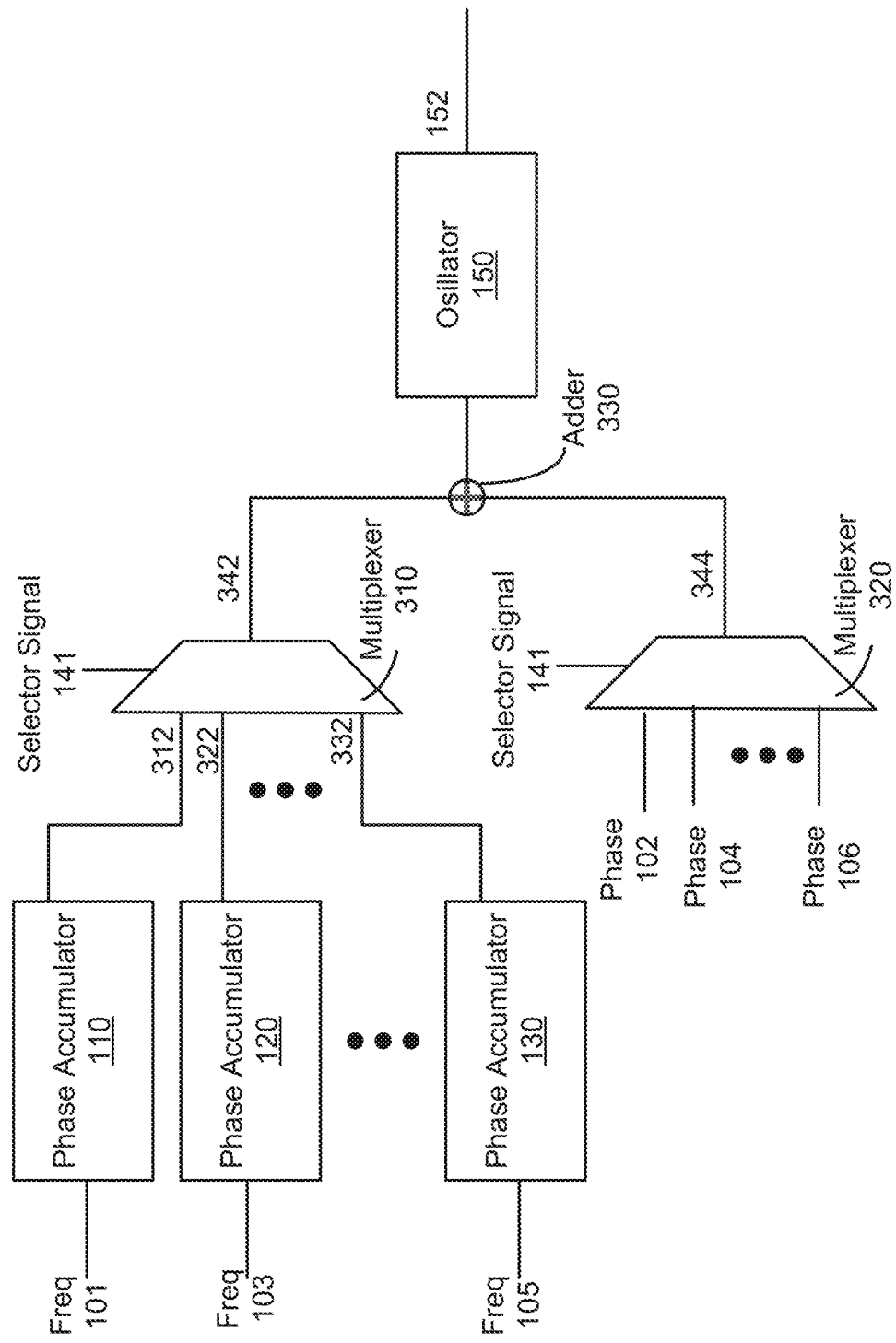
FIG. 3 shows an illustrative block diagram depicting a mixer device with coherent phase, according to some examples.

Referring now to FIG. 3, an illustrative block diagram depicting a mixer device with coherent phase, according to some examples is shown. FIG. 3 is substantially similar to that of FIGS. 1A and 1B. In this embodiment, however, two multiplexers are used. For example, a multiplexer 310 is used to select an appropriate frequency signal associated with a ramp signal of a phase accumulator while a multiplexer 320 is used to select an appropriate phase signal associated with a ramp signal of a phase accumulator. In some embodiments, the multiplexer 310 receives the frequency of the ramp signals 312, 322, . . . , 332. The multiplexer 310 also receives the select signal 141 to select a desired ramp signal (hence desired frequency). The multiplexer 310 outputs the selected frequency signal 342. It is appreciated that in some embodiments, the multiplexer 320 selecting a phase from a plurality of phases, e.g., phase 102, phase 104, . . . , phase 106, and output signal 344. The output of the multiplexers 310 and 320, hence signals 342 and 344 are added to one another using an adder 330. The output of the adder 330 is transmitted to the oscillator 150.

Figure 4:
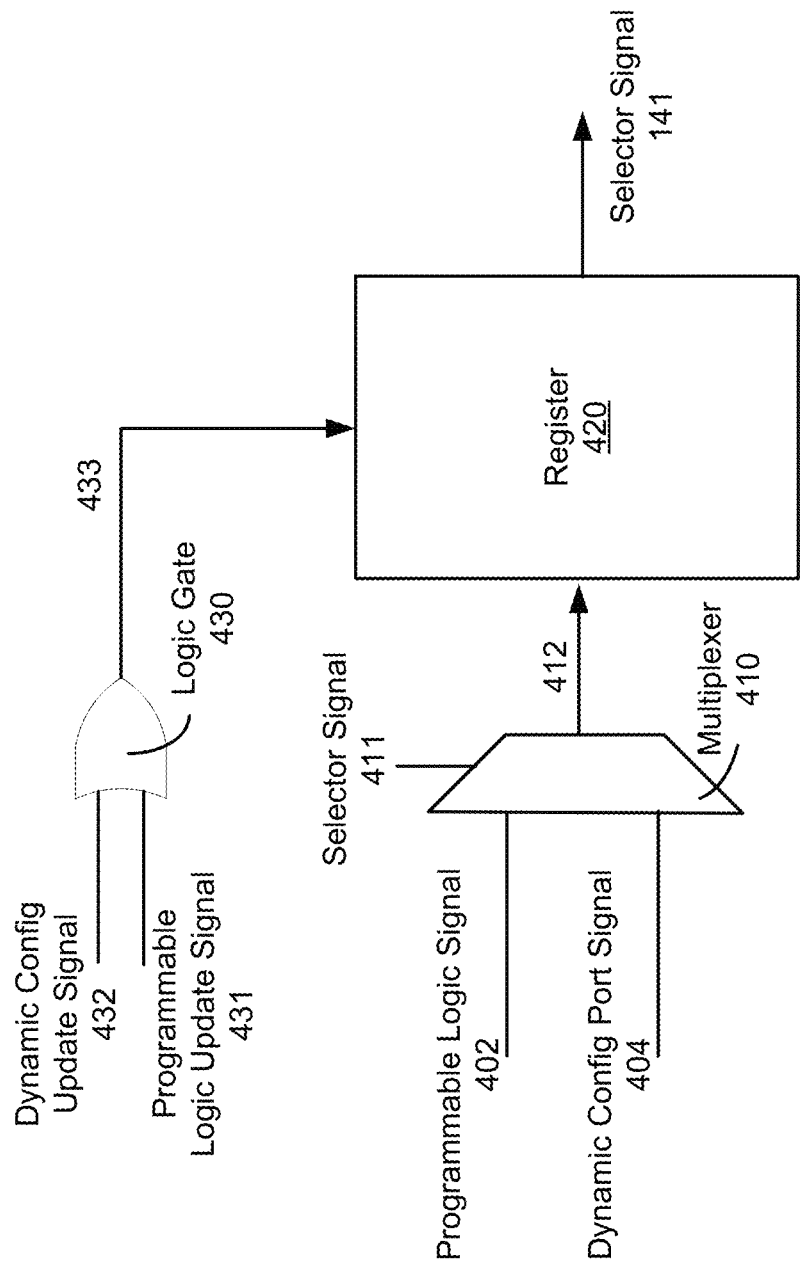
FIG. 4 shows programmable block of the mixer device, according to some examples.

Referring now to FIG. 4, programmable block of the mixer device, according to some examples is shown. In this embodiment, generation of the selector signal 141 according to some embodiments is shown. The multiplexer 410 receives input signals programmable logic signal 402 and dynamic configuration port signal 404 as well as a selector signal 411. The programmable logic signal 402 is a selection of ramp signal using a programmable device. The dynamic configuration port signal 404 is a selection of a ramp signal from a configuration port, for example. The multiplexer 410 selects between the input signals based on its selector signal 411. The selected signal 412 is input to the register 420 where the frequency value is stored.

According to some embodiments, a logic gate 430 may receive two input signals, a dynamic configuration update signal 432 and a programmable logic update signal 431. The logic gate 430 is a triggering component that determines whether a frequency hop, e.g., frequency up/down shift is requested. The dynamic configuration signal 432 may be an indication whether a different frequency is desired, e.g., on the fly. In contrast, the programmable logic update signal 431 may be an indication whether a different frequency update is desired based on a programmable device. If an update for a frequency is requested, hence a frequency hop, the output 433 of the logic gate 430 goes high.

Once the output signal 433 indicates that a frequency update is requested, the content of the register 420, hence the desired frequency, is output from the register 420. The output of the register 420 is the selector signal 141 that enables the multiplexer 140 to select the appropriate frequency. It is appreciated that other architectures to select a frequency or to program a different frequency may be utilized and the architecture shown is for illustrative purposes and should not be construed as limiting the scope of the embodiments. It is further appreciated that the use of the logic gates, as shown, is for illustrative purposes and should not be construed as limiting the scope of the embodiments and that a different architecture may be used to select an appropriate frequency.

Accordingly, a single cordic core may be used to generate an amplitude signal for all frequencies (shift up/down), therefore reducing areal requirement in comparison to using multiple oscillators. It is further appreciated that a user may select and update the frequency using a programmable logic device. Moreover, it is appreciated that the embodiments as described can be used to select and update frequencies for some or all oscillators (e.g., NCOs) within a single chip or across multiple applications. Furthermore, since each phase accumulator continues to generate its ramp signal in parallel the phase coherency is maintained, thereby eliminating the need to resynchronize.

Figure 5:
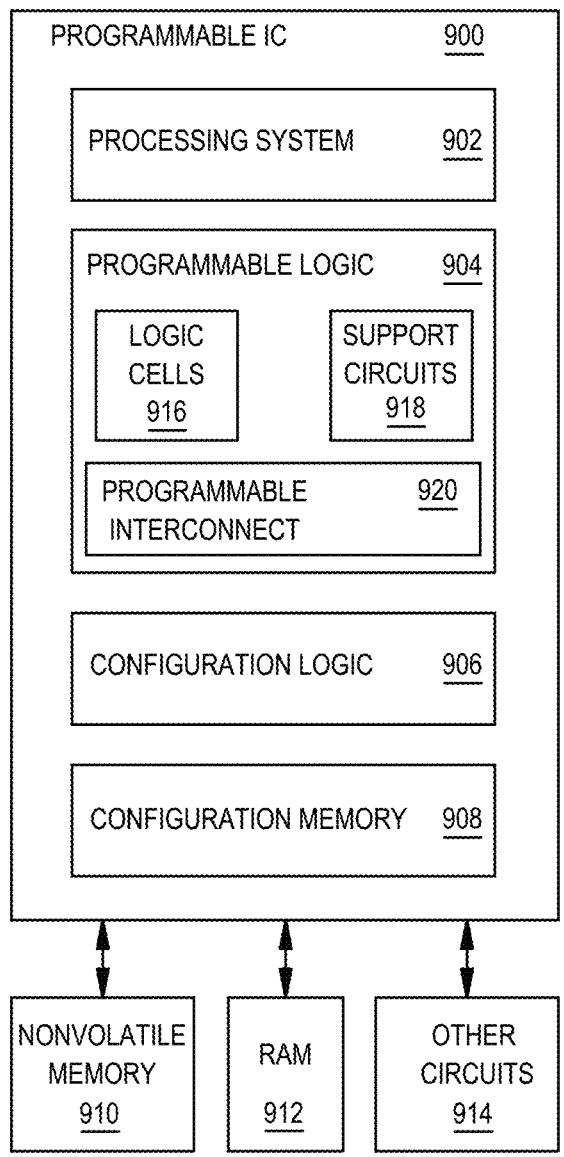
FIG. 5 is a block diagram depicting a programmable integrated circuit (IC), according to some examples.

FIG. 5 is a block diagram depicting a programmable integrated circuit (IC) 900 according to an example. The programmable IC 900 can implement the integrated circuit (IC) chip of systems of FIGS. 1A-4, in whole or in part. The programmable IC 900 includes a processing system 902, programmable logic 904, configuration logic 906, and configuration memory 908. The programmable IC 900 can be coupled to external circuits, such as nonvolatile memory 910, RAM 912, and other circuits 914.

In the example of FIG. 5, the processing system 902 can include microprocessor(s), memory, support circuits, IO circuits, and the like. The programmable logic 904 includes logic cells 916, support circuits 918, and programmable interconnect 920. The logic cells 916 include circuits that can be configured to implement general logic functions of a plurality of inputs. The support circuits 918 include dedicated circuits, such as transceivers, input/output blocks, digital signal processors, memories, and the like. The logic cells and the support circuits 918 can be interconnected using the programmable interconnect 920. Information for programming the logic cells 916, for setting parameters of the support circuits 918, and for programming the programmable interconnect 920 is stored in the configuration memory 908 by the configuration logic 906. The configuration logic 906 can obtain the configuration data from the nonvolatile memory 910 or any other source (e.g., the RAM 912 or from the other circuits 914).

Figure 6:
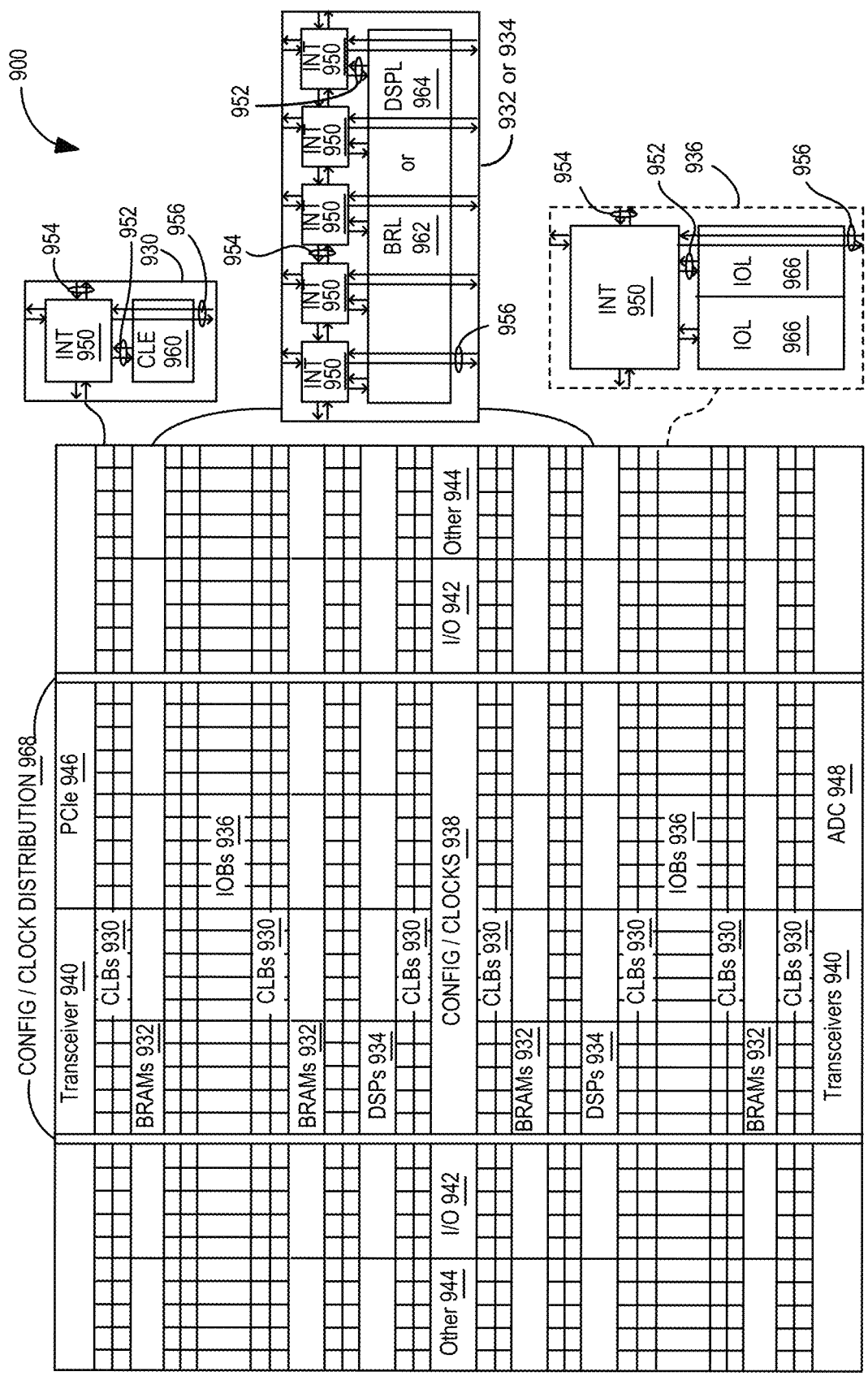
FIG. 6 is a field programmable gate array (FPGA) implementation of the programmable IC, according to some examples.

FIG. 6 illustrates an FPGA implementation of the programmable IC 900 that includes a large number of different programmable tiles including configurable logic blocks ("CLBs") 930, random access memory blocks ("BRAMs") 932, signal processing blocks ("DSPs") 934, input/output blocks ("IOBs") 936, configuration and clocking logic ("CONFIG/CLOCKS") 938, digital transceivers 940, specialized input/output blocks ("I/O") 942 (e.g., configuration ports and clock ports), and other programmable logic 944 such as digital clock managers, system monitoring logic, and so forth. The FPGA can also include PCIe interfaces 946, analog-to-digital converters (ADC) 948, and the like.

In some FPGAs, each programmable tile can include at least one programmable interconnect element ("INT") 950 having connections to input and output terminals 952 of a programmable logic element within the same tile, as shown by examples included in FIG. 6. Each programmable interconnect element 950 can also include connections to interconnect segments 954 of adjacent programmable interconnect element(s) in the same tile or other tile(s). Each programmable interconnect element 950 can also include connections to interconnect segments 956 of general routing resources between logic blocks (not shown). The general routing resources can include routing channels between logic blocks (not shown) comprising tracks of interconnect segments (e.g., interconnect segments 956) and switch blocks (not shown) for connecting interconnect segments. The interconnect segments of the general routing resources (e.g., interconnect segments 956) can span one or more logic blocks. The programmable interconnect elements 950 taken together with the general routing resources implement a programmable interconnect structure ("programmable interconnect") for the illustrated FPGA.

In an example implementation, a CLB 930 can include a configurable logic element ("CLE") 960 that can be programmed to implement user logic plus a single programmable interconnect element ("INT") 950. A BRAM 932 can include a BRAM logic element ("BRL") 962 in addition to one or more programmable interconnect elements. Typically, the number of interconnect elements included in a tile depends on the height of the tile. In the pictured example, a BRAM tile has the same height as five CLBs, but other numbers (e.g., four) can also be used. A signal processing block 934 can include a DSP logic element ("DSPL") 964 in addition to an appropriate number of programmable interconnect elements. An IOB 936 can include, for example, two instances of an input/output logic element ("IOL") 966 in addition to one instance of the programmable interconnect element 950. As will be clear to those of skill in the art, the actual I/O pads connected, for example, to the input/output logic element 966 typically are not confined to the area of the input/output logic element 966.

In the pictured example, a horizontal area near the center of the die is used for configuration, clock, and other control logic. Vertical columns 968 extending from this horizontal area or column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic.

Note that FIG. 6 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 6 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A device comprising:
a plurality of phase accumulators, wherein each phase accumulator of the plurality of phase accumulators is configured to receive a respective frequency and a respective phase and wherein the each phase accumulator is clocked in by a clocking signal, wherein the each phase accumulator is configured to generate a frequency ramp signal with a same frequency as each phase accumulator's respective frequency and wherein each phase accumulator's phase changes from each phase accumulator's respective phase by a step size as the each phase accumulator is clocked in by the clocking signal, each of the plurality of phase accumulators further comprising a first adder for receiving the frequency ramp signal and a second adder for receiving the step size;
a multiplexer configured to receive the plurality of frequency ramp signals from the plurality of phase accumulators and to select one frequency ramp signal associated with one phase accumulator of the plurality of phase accumulators; and
a sine generator configured to receive the one selected frequency ramp signal and to generate one amplitude signal associated therewith,
and wherein each phase accumulator of the plurality of phase accumulators continues generating their respective frequency ramp signal simultaneously, and wherein the multiplexer subsequent to selecting the one frequency ramp signal is configured to select another frequency ramp signal associated with another one phase accumulator of the plurality of phase accumulators and wherein the sine generator is further configured to receive the selected another frequency ramp signal and to generate another amplitude signal associated therewith, wherein the another amplitude signal is a frequency hop with respect to the one amplitude signal and wherein phase coherency between the one selected frequency ramp signal and the another selected frequency ramp signal is maintained.

2. The device of claim 1 further comprising a cosine generator configured to receive the one selected frequency ramp signal and to generate a complex amplitude signal associated therewith.

3. The device of claim 1, wherein each phase accumulator of the plurality of phase accumulators is clocked at a sampling frequency.

4. The device of claim 1, wherein the step size for the respective phase for each phase accumulator of the plurality of phase accumulators is added to the respective phase in the second adder.

5. The device of claim 1, wherein the step size for each phase accumulator of the plurality of phase accumulators is identified by a register and clocked in using a clocking signal.

6. The device of claim 1, wherein the phase changes are within a −180 degrees to 180 degrees or 0 degrees to 360 degrees.

7. The device of claim 1, wherein the multiplexer is configured to receive a select signal to select a frequency ramp signal from the plurality of frequency ramp signals.

8. The device of claim 7, wherein the select signal is user configurable.

9. The device of claim 1, wherein the phase for each frequency ramp signal changes from each frequency ramp signal's respective phase by the step size until overall 360 degrees is spanned upon which the phase returns back to each frequency ramp signal's respective phase.

10. The device of claim 1, wherein the respective frequency associated with each phase accumulator of the plurality of phase accumulators are different from one another.

11. A device comprising:
a plurality of phase accumulators configured to receive a plurality of frequencies and generate a plurality of ramp signals;
a first multiplexer configured to receive the plurality of ramp signals from the plurality of phase accumulators and to select one ramp signal from the plurality of ramp signals;
a second multiplexer configured to select a phase from a plurality of phases, the phase associated with the plurality of ramp signals; and
an oscillator configured to receive an output from an adder, the output comprising the one selected ramp signal and the phase, and the output configured to generate one amplitude signal associated with the output,
and wherein the plurality of phase accumulators continues generating their respective ramp signal, and wherein the first multiplexer subsequent to selecting the one ramp signal is configured to select another ramp signal associated with another one phase accumulator of the plurality of phase accumulators and wherein the oscillator is further configured to receive the selected another ramp signal and to generate another amplitude signal associated therewith.

12. The device of claim 11, wherein the another amplitude signal is a frequency hop with respect to the one amplitude signal and wherein phase coherency between the one selected ramp signal and the another selected ramp signal is maintained.

13. The device of claim 11, wherein the oscillator comprises a sine generator.

14. The device of claim 13, wherein the oscillator comprises a cosine generator.

15. The device of claim 11, wherein each phase accumulator of the plurality of phase accumulators is clocked at a sampling frequency.

16. The device of claim 11, wherein the phase for each phase accumulator of the plurality of phase accumulators is the same.

17. The device of claim 11, wherein a step size for each phase accumulator of the plurality of phase accumulators is the same.

18. The device of claim 11, wherein the phase changes are within a −180 degrees to 180 degrees or 0 degrees to 360 degrees.

19. The device of claim 11, wherein the first multiplexer is configured to receive a select signal to select a ramp signal from the plurality of ramp signals.

20. The device of claim 19, wherein the select signal is user controllable.

\* \* \* \* \*